US011744035B1

(12) United States Patent
Behnam (10) Patent No.: US 11,744,035 B1
(45) Date of Patent: Aug. 29, 2023

(54) MODULAR EXPANDABLE CORRIDOR RACKING SYSTEM FOR DATACENTER

(71) Applicant: Amazon Technologies, Inc., Seattle, WA (US)

(72) Inventor: Hamdolah Behnam, North Parramatta (AU)

(73) Assignee: Amazon Technologies, Inc., Seattle, WA (US)

( * ) Notice: Subject to any disclaimer, the term of this patent is extended or adjusted under 35 U.S.C. 154(b) by 155 days.

(21) Appl. No.: 17/337,817

(22) Filed: Jun. 3, 2021

(51) Int. Cl.
*H05K 7/14* (2006.01)
*H05K 7/20* (2006.01)

(52) U.S. Cl.
CPC ......... *H05K 7/1497* (2013.01); *H05K 7/1487* (2013.01); *H05K 7/1491* (2013.01); *H05K 7/20709* (2013.01)

(58) Field of Classification Search
None
See application file for complete search history.

(56) References Cited

U.S. PATENT DOCUMENTS

| 5,340,268 | A | * | 8/1994 | Dowty | B66F 9/18 |
| | | | | | 414/622 |
| 6,422,405 | B1 | * | 7/2002 | Haenszel | B65D 85/68 |
| | | | | | 211/208 |
| 10,834,838 | B1 | * | 11/2020 | Ross | H05K 7/18 |
| 10,863,646 | B1 | * | 12/2020 | Rampey | A47B 61/02 |
| 11,228,166 | B1 | * | 1/2022 | Rampey | F16L 3/26 |

FOREIGN PATENT DOCUMENTS

WO WO-2017129448 A1 * 8/2017 ............. B23P 15/26

* cited by examiner

*Primary Examiner* — James Wu
*Assistant Examiner* — Christopher L Augustin
(74) *Attorney, Agent, or Firm* — Kilpatrick Townsend & Stockton LLP (57) ABSTRACT

A deployable assembly can be positioned within a building for a datacenter or other environment. An upper frame can be released from the deployable assembly and lifted to allow lower ends of the upper frame to be coupled with upper ends of columns that also form part of the deployable assembly. The deployable assembly can be laterally expanded to extend horizontal members, such as in the upper frame and/or in a core chassis that may further form part of the deployable assembly. The lateral expansion can reach a size suitable for a cold aisle corridor, for example. The core chassis can be raised into a raised position within the upper frame, for example, such that trays within the core chassis are suitably positioned for receiving cabling from computing components to be arranged along the cold aisle corridor.

17 Claims, 9 Drawing Sheets

MODULAR EXPANDABLE CORRIDOR RACKING SYSTEM FOR DATACENTER

BACKGROUND

Datacenters house collections of servers and networking hardware, including switches and routers. As the demand for datacenters continues to increase, a need exists to limit the cost of operating a datacenter. Often, a pertinent part of the cost of operating a datacenter relates to the labor costs of installing, removing, or otherwise servicing server racks or other infrastructural elements of a datacenter. Such labor costs may be incurred during initial setup of a datacenter, expanding a capacity of a datacenter, or during routine maintenance to service parts or replace parts that have reached the end of their useful life. In addition, speed of installation or other servicing actions can be a significant factor in controlling costs and/or reducing a time delay until operations can begin (or resume).

BRIEF DESCRIPTION OF THE DRAWINGS

Various embodiments in accordance with the present disclosure will be described with reference to the drawings, in which.

DETAILED DESCRIPTION

Techniques herein can relate to assemblies that may be utilized to construct cold aisles or other zones within a datacenter or other building. The assembly may begin as a combination of releasably coupled subcomponents that are suitably held together by releasable fasteners so that the whole assembly can be rolled on casters or otherwise moved as a combined whole. For example, the assembly may be moved on casters to arrive at a suitable position for deployment within a datacenter or other building. The assembly can include a core chassis, a preassembled skeletal upper frame, and a set of support columns. During installation, the upper frame can be decoupled from the remainder of the assembly. For example, fasteners may be released so that the upper frame may be pulled off as an outside layer from the assembly. The upper frame may correspond to a series of members interconnected to form an inverted-U shape when viewed from an end (e.g., with a horizontal beam connected at each end with vertical uprights). The upper frame may also include longitudinal runners that run along a length of the upper frame and interconnect respective inverted-U-shaped portions to one another.

Next, the upper frame can be elevated in the air, such as by a scissor lift, crane, or other suitable lifter. In such an elevated position, the support columns of the assembly can be moved underneath the upper frame (e.g., by laterally expanding the core chassis and/or otherwise moving the columns apart from one another), which can facilitate attachment of the upper frame to the support columns positioned underneath. For example, suitable couplers may be used to couple upper ends of the support columns with the lower ends of downwardly projecting members (uprights) of the upper frame. Coupling of the support columns to the underside or lower extremity of the upper frame may effectively vertically extend the downwardly projecting arms of the inverted-U shape of the upper frame. Such vertical extension of the inverted-U shape may allow the elements of the upper frame to be supported (e.g., by the support columns) in an elevated position relative to a floor of the building.

In the preassembled state of the assembly prior to arrival at the datacenter or other building for installation, the support columns and the upper frame may be coupled with and supported by the inner core chassis, e.g., which may facilitate movement of the assembly as a whole. For example, the inner core chassis on an underside may include casters capable of moving the entire assembly as result of the support columns and the upper frame being coupled with the inner core. The inner core can include laterally telescoping braces along a roof or other portion of the inner core. The beams of the upper frame may additionally be capable of laterally telescoping. With the upper frame attached to the support columns and with the support columns still attached to the inner core chassis, the assembly can be expanded laterally (e.g., telescoping along the upper beams of the upper frame and the lateral braces of the inner core). For example, the assembly may be expanded laterally from a size that may be suitable for fitting within a shipping container to a size that may be suitable for forming an enclosure or corridor of a cold aisle in a datacenter.

Next, the inner core may be decoupled from the support columns. The combination of the support columns and the upper frame (e.g., the extended U-shaped subassembly) may be bolted or otherwise secured to a floor of the building, which may fix a lateral width of the subassembly. The inner core chassis may be lifted within the subassembly and connected within the upper frame. Casters or other movement-facilitating components may be removed from the underside of the inner core. The inner core chassis may include a set of cable trays or other components, which (e.g., as a result of the lifting and connecting of the inner core within the elevated upper frame) may be positioned above an open space suitable for receiving server racks or other computing-component racks that may be interconnected by cabling or other conduits routed through the cable trays or other components within the inner core.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
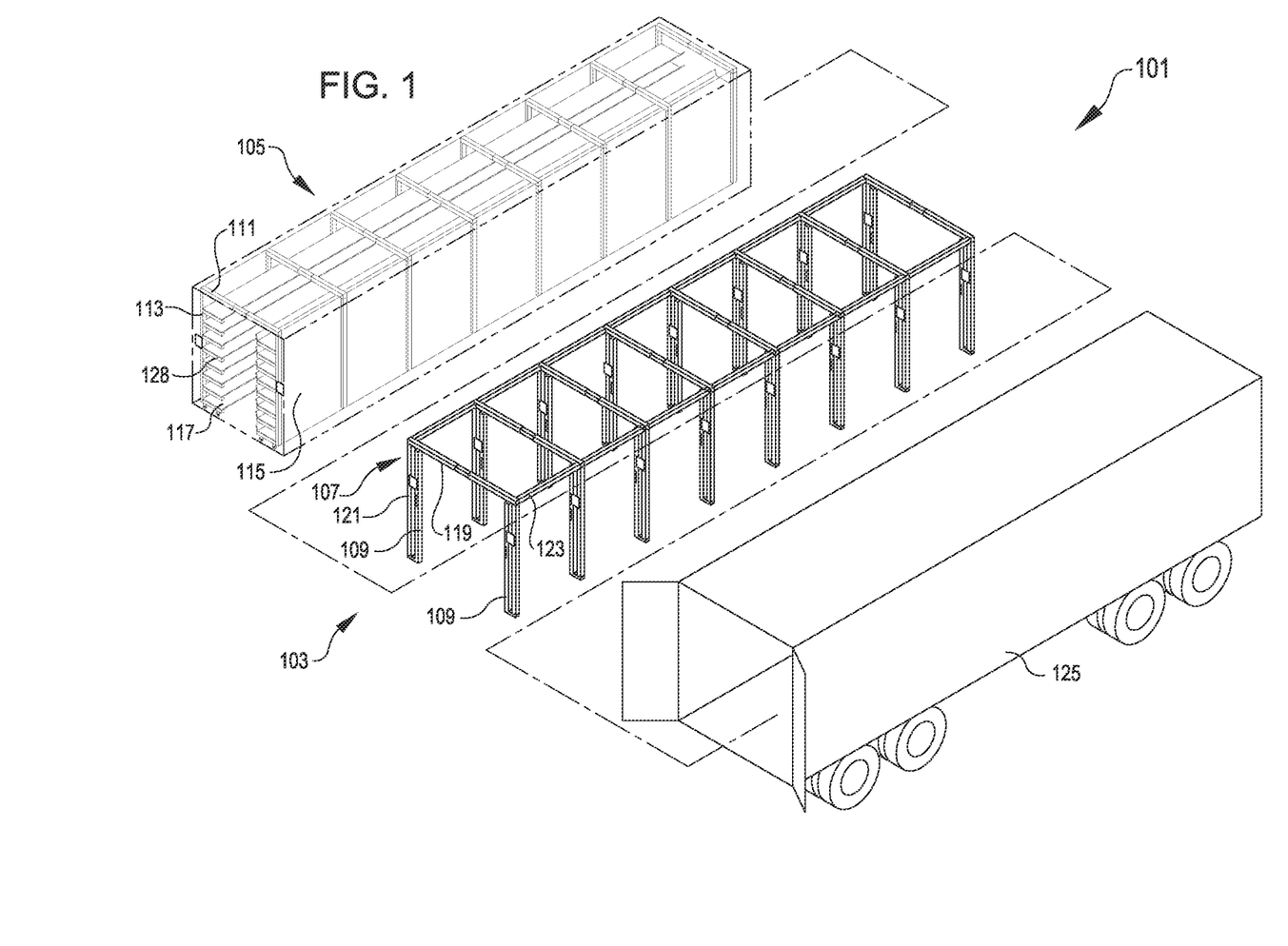
FIG. 1 is a perspective view of an example of a system that may be utilized for defining an aisle or corridor structure according to various embodiments.

Turning now to the figures, FIG. 1 depicts a perspective view of an example of a system 101 that may be utilized for defining an aisle or corridor structure. The system 101 can include a deployable assembly 103, which may be modular, for example. The deployable assembly 103 may be formed of suitable subcomponents and/or subassemblies. For example, the deployable assembly 103 in FIG. 1 includes a core chassis 105, an upper frame 107, and a set of columns 109. The respective parts of the subassemblies may be constructed, combined, and/or formed into an assembly that may be suitable for racking or forming a cold aisle corridor for a datacenter, for example.

The core chassis 105 can include any suitable combination of lateral braces 111, vertical braces 113, and longitudinal braces 115. The lateral braces 111 may be telescoping or otherwise expandable or extendable. The core chassis 105 can include any suitable structure for supporting other elements of the system 101. For example, the core chassis 105 depicted in FIG. 1 includes trays 117. The trays 117 may be suitable for supporting cabling in a datacenter environment and/or may be replaced or supplemented with other structures that may be suitable for an end environment in which the core chassis 105 is utilized. Although the core chassis 105 is shown in FIG. 1 with a particular arrangement of lateral braces 111, vertical braces 113, and longitudinal braces 115, any suitable combination or arrangement may be utilized. For example, although respective elements of the core chassis 105 are largely shown positioned along a periphery or boundary of the core chassis 105, parts may additionally or alternatively be positioned to extend through a middle or other portion of the core chassis 105. Although the longitudinal braces 115 are shown substantially as walls in FIG. 1, rails or other structures may additionally or alternatively be used to interconnect the lateral braces 111 and/or the vertical braces 113 (e.g., to establish connection between successive lateral braces 111, between successive vertical braces 113, and/or to establish connection and continuity between lateral braces 111 and vertical braces 113 or some combination thereof).

The upper frame 107 shown in FIG. 1 includes beams 119, uprights 121, and runners 123. The beams 119 may be telescoping or otherwise expandable or extendable. The beams 119 and the uprights 121 may be connected to form a substantially inverted-U shape or geometry. The runners 123 may be positioned to extend between the other elements of the upper frame 107, e.g., to join respective instances of the inverted-U shape formed by the beams 119 and uprights 121.

The set of columns 109 can also be suitably included in the deployable assembly 103. The columns 109 and/or any other element of the deployable assembly 103 may be constructed of steel, or other suitable materials capable of providing suitable support to other elements of the deployable assembly 103 and/or other elements that may be coupled therewith in use. Although generally depicted as elongate members in which one dimension (e.g., a height dimension of the columns 109) is substantially larger than either or both of the width and/or depth directions, the columns 109 and/or other elements of the system 101 can include any aspect ratio, including arrangements in which multiple of the height, width, and/or depth of the column 109 or other element is substantial (e.g., resembling a panel or a block).

Elements of the deployable assembly 103 may be coupled together by suitable attachment structures, some examples of which are discussed herein in greater detail with respect to subsequent figures. The attachment structures may be utilized to releasably fasten elements of the deployable assembly 103 together in any configuration suitable for facilitating subsequent deployment of the elements. As one example, the columns 109 in FIG. 1 are shown coupled directly to the upper frame 107. This may form a subassembly that can in turn be coupled with the core chassis 105, e.g., which may arrange the columns 109 as intervening structure by which the upper frame 107 is coupled with the core chassis 105. However, elements of the deployable assembly 103 may be coupled together in any other suitable manners, which may include, but are not limited to, the upper frame 107 being directly coupled with the core chassis 105, the columns 109 being indirectly coupled with the core chassis 105 by intervening structure of the upper frame 107, or other combinations of direct or indirect attachment of elements with or without intervening structure positioned therebetween. The attachment structures may couple elements of the deployable assembly 103 together in any relative arrangement. For example, the deployable assembly 103 may be assembled such that the uprights 121 of the upper frame 107 and/or the columns 109 are respectively coupled at positions corresponding to the vertical braces 113 of the core chassis 105 and/or such that the beams 119 of the upper frame 107 are coupled at positions corresponding to the lateral braces 111 of the core chassis 105.

In use, the elements of the deployable assembly 103 can be coupled together to form a whole that may facilitate subsequent handling. For example, the deployable assembly 103 can be introduced into a shipping container 125, e.g., by being built or assembled within the shipping container 125 or by being built and then moved as a whole into the shipping container 125. The shipping container 125 may contain and carry the deployable assembly 103 for transit to a datacenter or other location for deployment and installation, for example.

Figure 2:
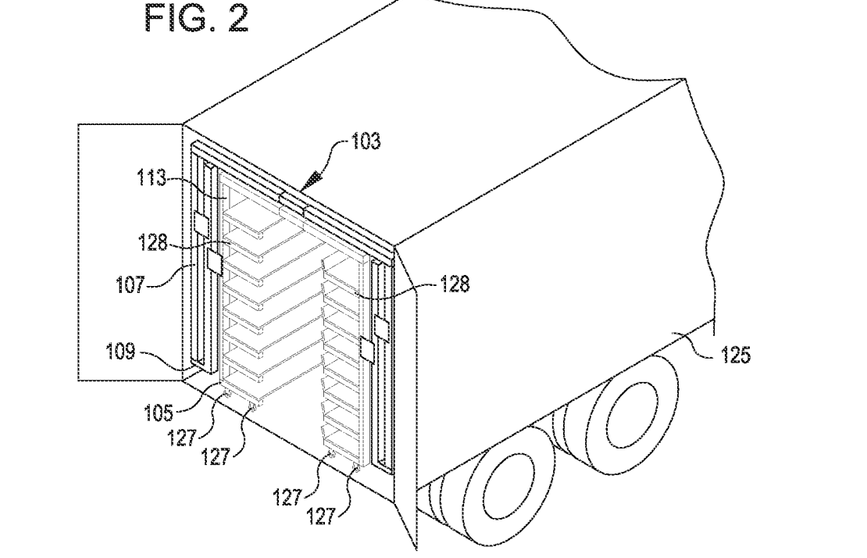
FIG. 2 is a perspective view of elements of the system of FIG. 1 in a shipping container according to various embodiments.

FIG. 2 illustrates a perspective view of an example of the deployable assembly 103 in a transit configuration. The deployable assembly 103 can be re-configurable between the transit configuration and a deployed configuration. The transit configuration may facilitate movement of the deployable assembly 103 between a place of original manufacture and a place of ultimate deployment, for example. The deployable assembly 103 in the transit configuration may be sized for fitting within a shipping container 125 having dimensions of 8 feet by 8 feet by 40 feet or other standardized or suitable dimensions.

The core chassis 105, the upper frame 107, and the set of columns 109 may be suitably coupled together to cause the deployable assembly 103 to be movable as an integrated or combined whole. For example, in FIG. 2, the core chassis 105 on an underside includes rolling elements 127 that may facilitate movement of the deployable assembly 103 as a whole, such as for movement into or out of the shipping container 125 and/or at a location for deployment and/or installation. Although the deployable assembly 103 is depicted with four rolling elements 127 arranged on an underside of the core chassis 105, any other number (including, one, two, three, or more) and/or other arrangement (e.g., in which rolling elements 127 attach elsewhere to the deployable assembly 103) may be utilized.

The deployable assembly 103 can include suitable combinations of elements to provide structural stability while avoiding unnecessary weight. For example, in FIG. 2, the trays 117 within the core chassis 105 are shown supported by arms 128 that may extend inwardly from the vertical braces 113 of the core chassis 105 without also extending substantially along the longitudinal length of the deployable assembly 103.

Figure 3:
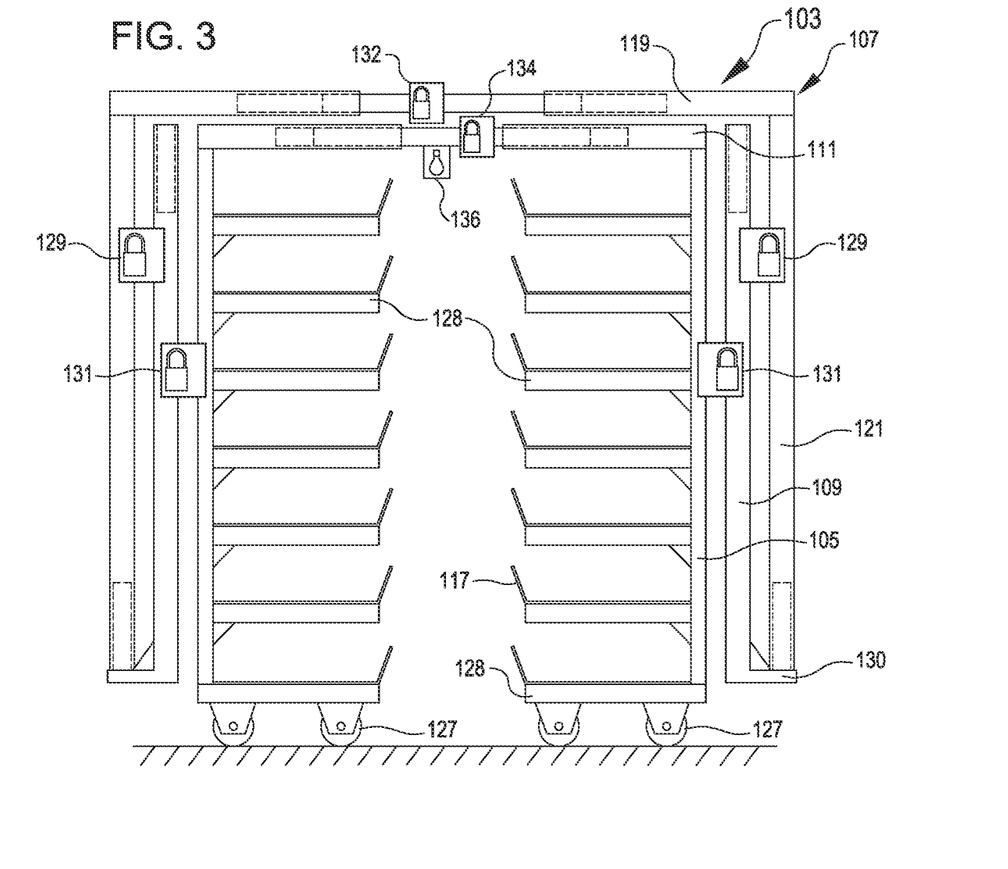
FIG. 3 is an end view of elements of the system of FIG. 1 in position for deployment in a datacenter or other building according to various embodiments.

FIG. 3 is an end view showing an example of the deployable assembly 103 in the transport configuration and apart from the shipping container 125 depicted in FIG. 2. For example, the state depicted in FIG. 3 may correspond to a configuration in which the deployable assembly 103 is received at a building for a datacenter or other context. The deployable assembly 103 may be moved into position within the building via the rolling elements 127.

The upper frame 107 can be associated with a first set of releasable fasteners 129 suitable for releasably attaching the upper frame 107 relative to the deployable assembly 103. For example, the first set of releasable fasteners 129 may couple the upper frame 107 with the column 109, the core chassis 105, and/or other elements of the deployable assembly 103. The first set of releasable fasteners 129 may correspond to a plate having suitable bolts for attachment to different elements and retaining the elements in position relative to one another. However, any releasable fasteners may be utilized, including, but not limited to, plates, bolts, hooks, and or other suitable structures. For simplicity, a lock symbol is utilized to graphically represent that the first set of releasable fasteners 129 are in a fastened state in FIG. 3. The upper frame 107 may additionally or alternatively be supported at least in part by baseplates 130 that may be coupled with or integral with the columns 109.

The columns 109 can be associated with a second set of releasable fasteners 131 suitable for releasably attaching the columns 109 relative to the deployable assembly 103. For example, the second set of releasable fasteners 131 may couple one or more of the columns 109 with the upper frame 107, the core chassis 105, and/or other elements of the deployable assembly 103. The second set of releasable fasteners 131 may utilize types of fasteners that may be similar to or different from those described for the first set of releasable fasteners 129. Although the second set of releasable fasteners 131 are shown separate or distinct from the first set of releasable fasteners 129, these may employ shared plates or other shared structure. For example, a single plate may extend across portions of the core chassis 105, a given column 109, and/or a portion of the upper frame 107, and/or may include different bolts or release mechanisms by which the respective elements can be individually released (e.g., without impacting whether other elements are also released from one another).

The beam 119 of the upper frame 107 can be associated with a first lock 132 suitable for locking or unlocking the beam 119 for lateral resizing. The first lock 132 may correspond to a set of one or more bolts that may engage through-holes traversing multiple parts of the beam 119 to prevent relative displacement and which may be removed or disengaged to permit telescoping or other lateral resizing. However, any releasable fasteners may be utilized, including, but not limited to, plates, bolts, hooks, and or other suitable structures. For simplicity, a lock symbol is utilized to graphically represent that the first lock 132 in a locked state in FIG. 3.

The lateral brace 111 of the core chassis 105 can be associated with a second lock 134 suitable for locking or unlocking the lateral brace 111 for lateral resizing. The second lock 134 may utilize types of fasteners that may be similar to or different from those described for the first lock 132. Although the second lock 134 is shown separate or distinct from the first lock 132, these may employ shared bolts or other shared structure. For example, a single bolt may extend through portions of the upper frame 107 and/or the core chassis 105, and/or the first lock 132 and the second lock 134 may include different bolts or release mechanisms by which the respective elements can be individually released (e.g., without impacting whether other elements are also released from one another).

The core chassis 105 can contain any suitable components in addition to or in substitution for the trays 117, as represented by functional block 136. As one example, the functional block 136 is depicted with a light bulb symbol to denote that a light source may be included within or coupled with the core chassis 105. As further examples, the functional block 136 additionally or alternatively may represent that the core chassis 105 may include or be coupled with security fixtures, conduits, controllers or other control elements, and/or any other components that may be useful in a datacenter environment or other end use of the building in which the deployable assembly 103 is utilized.

Elements of the deployable assembly 103 can be manipulated to shift from the transit configuration to the deployed configuration, such as by operations described in subsequent figures. Operations to deploy elements may be performed once the deployable assembly 103 has been moved to a suitable position within the building for establishing a cold aisle corridor of a datacenter, for example.

Figure 4:
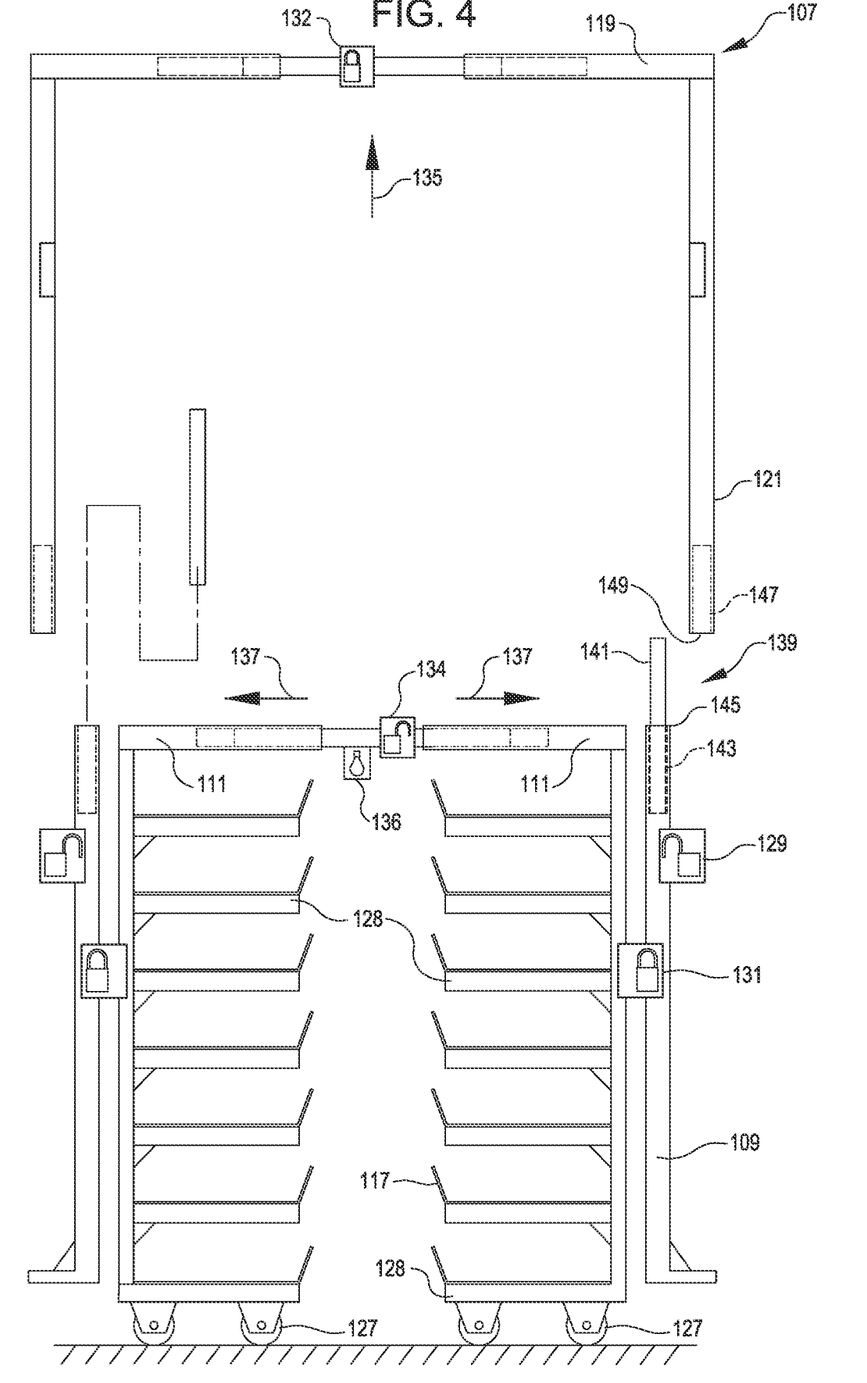
FIGS. 4 through 9 depict end views of elements of FIG. 3 in further additional differing states of installation and utilization according to various embodiments.

Turning to FIG. 4, the upper frame 107 may be released from the deployable assembly 103. In FIG. 4, the first set of releasable fasteners 129 is shown graphically with an unlocked symbol to denote a released state (in contrast to the lock symbol shown in FIG. 3). For example, the first set of releasable fasteners 129 may be released to permit removal of the upper frame 107 as an outer layer of the deployable assembly 103.

The upper frame 107 can be lifted (such as depicted by arrow 135). The upper frame 107 may be lifted by a scissor lift, crane, or other suitable lifter. Lifting the upper frame 107 may move the upper fame from a position alongside the columns 109 to a position above the columns 109.

The columns 109 can be moved apart from one another to align with the upper frame 107 (e.g., as depicted by arrows 137). For example, the second lock 134 may be released and allow the lateral brace 111 of core chassis 105 to be telescoped to bring the columns 109 into alignment underneath the uprights 121 of the upper frame 107.

Suitable couplers 139 may be utilized for joining the upper frame 107 and the columns 109. The couplers 139 are depicted in FIG. 4 as including a post 141 that can be received in a recess 143 in an upper end 145 of the column 109 and also in a recess 147 in a lower end 149 of the upright 121, although any other structure or type of coupler 139 may additionally or alternatively be utilized.

Figure 5:
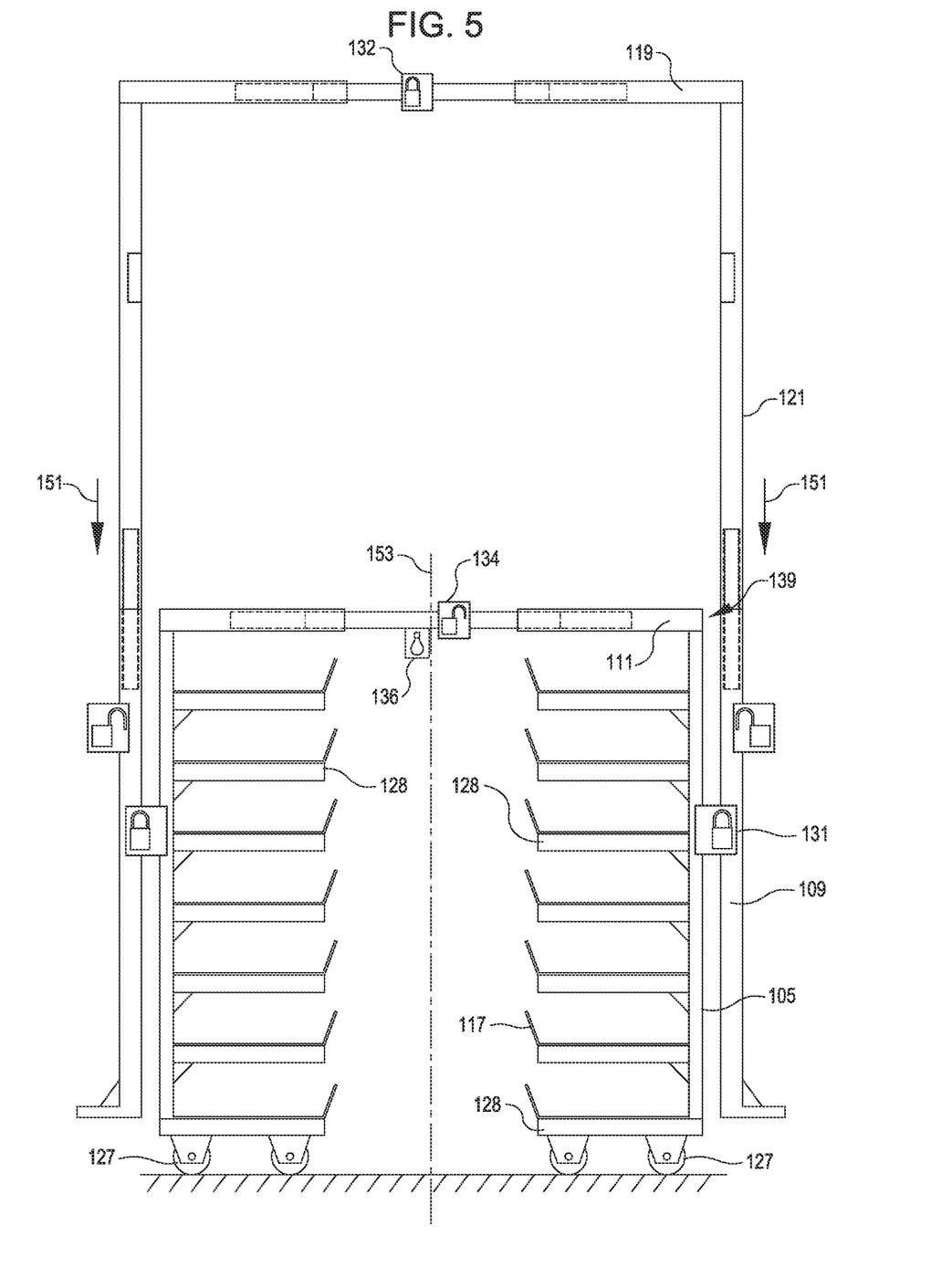

Turning to FIG. 5, the upper frame 107 may be lowered (e.g., as depicted by arrows 151). Lowering the upper frame 107 may facilitate coupling by the couplers 139 with the columns 109. Coupling by the couplers 139 may effectively convert the upper frame 107 into a vertically extended inverted-U-shaped structure that includes the upper frame 107 and the column 109. The couplers 139 may connect the upper frame 107 and the columns 109 in a relationship in which the columns 109 support the uprights 121 of the upper frame 107 from underneath. FIG. 5 also depicts a centerline 153 that may be useful for reference or comparison with respect to FIG. 6.

Figure 6:
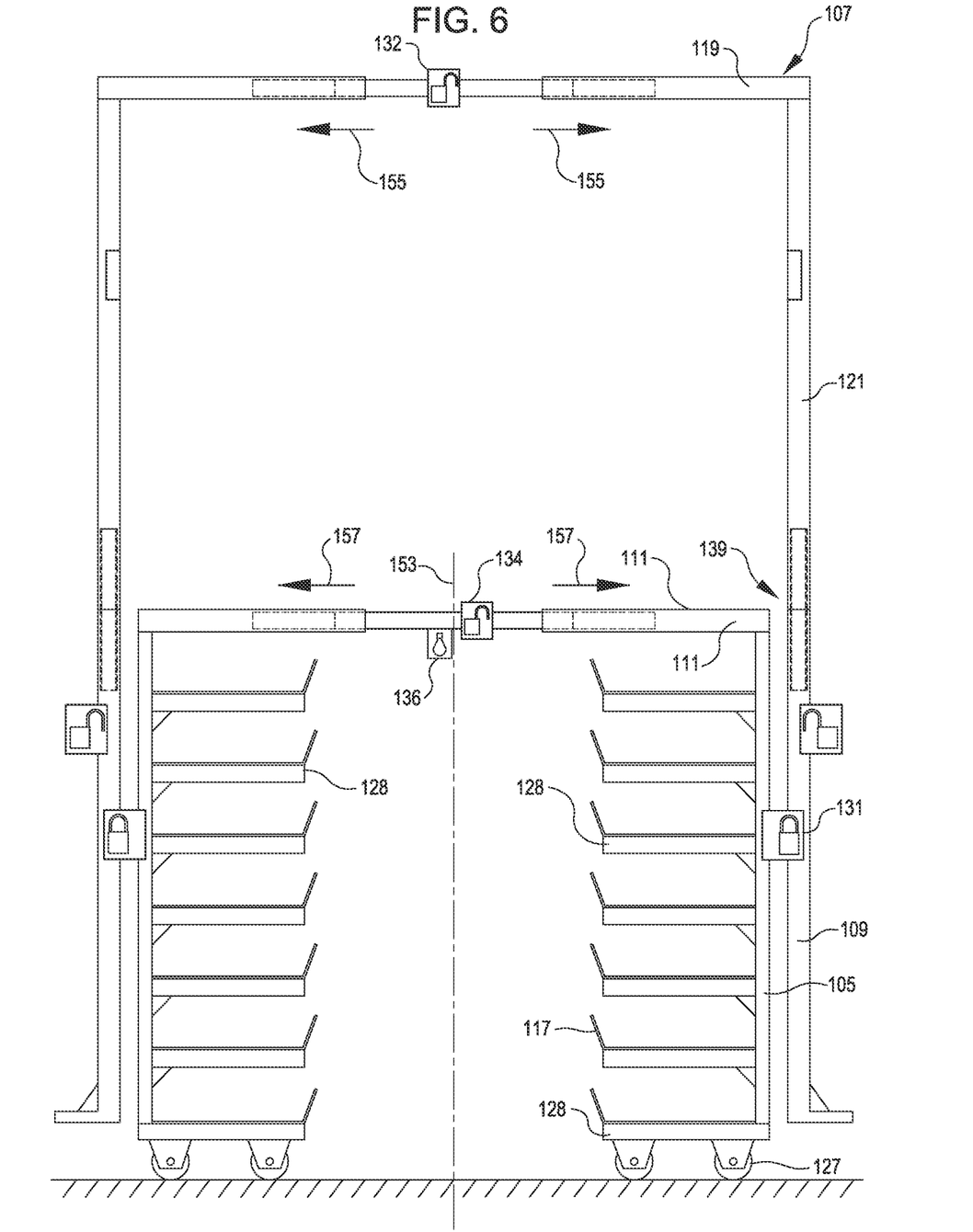

Turning to FIG. 6, horizontal members (such as the beam 119 and/or the lateral brace 111) of the deployable assembly 103 may be laterally extended away from a compact state and toward a laterally extended state (e.g., as depicted by arrows 155 and arrows 157). For example, the core chassis 105 or other element of the deployable assembly 103 may be pushed or pulled away from the centerline 153 (e.g., after disengaging and/or removing the first lock 132 and/or the second lock 134 to allow lateral movement of the horizontal members). Such pulling or pushing may cause the core chassis 105 to expand laterally as the lateral brace 111 expands (e.g., as depicted by arrows 157). Lateral movement may also cause the beam 119 to telescope or otherwise expand (e.g., as depicted by arrows 155). The same lateral pushing or pulling may cause both the lateral brace 111 of the core chassis 105 and the beam 119 of the upper frame 107 to expand together in a lateral direction. As an illustrative example, the lateral extension may cause movement of the deployable assembly 103 from an initial first lateral size for the transit configuration (such as 8 feet or less or other relevant dimension to fit within a standard shipping container or other initial constraint) and may expand to a second lateral size in the deployed configuration in which the columns 109 are positioned 12 feet apart or other suitable distance for a cold aisle corridor in a datacenter or other end use of the deployable assembly 103. Following lateral movement of the horizontal members, the first lock 132 and/or the second lock 134 may be reengaged and/or reinstalled. e.g., to provide additional rigidity and/or stability for subsequent operations. For example, whereas the first lock 132 and the second lock 134 in FIG. 6 are each shown graphically with an unlocked symbol to denote an unlocked state, each is depicted in FIG. 7 instead with a lock symbol to denote a locked state.

Figure 7:
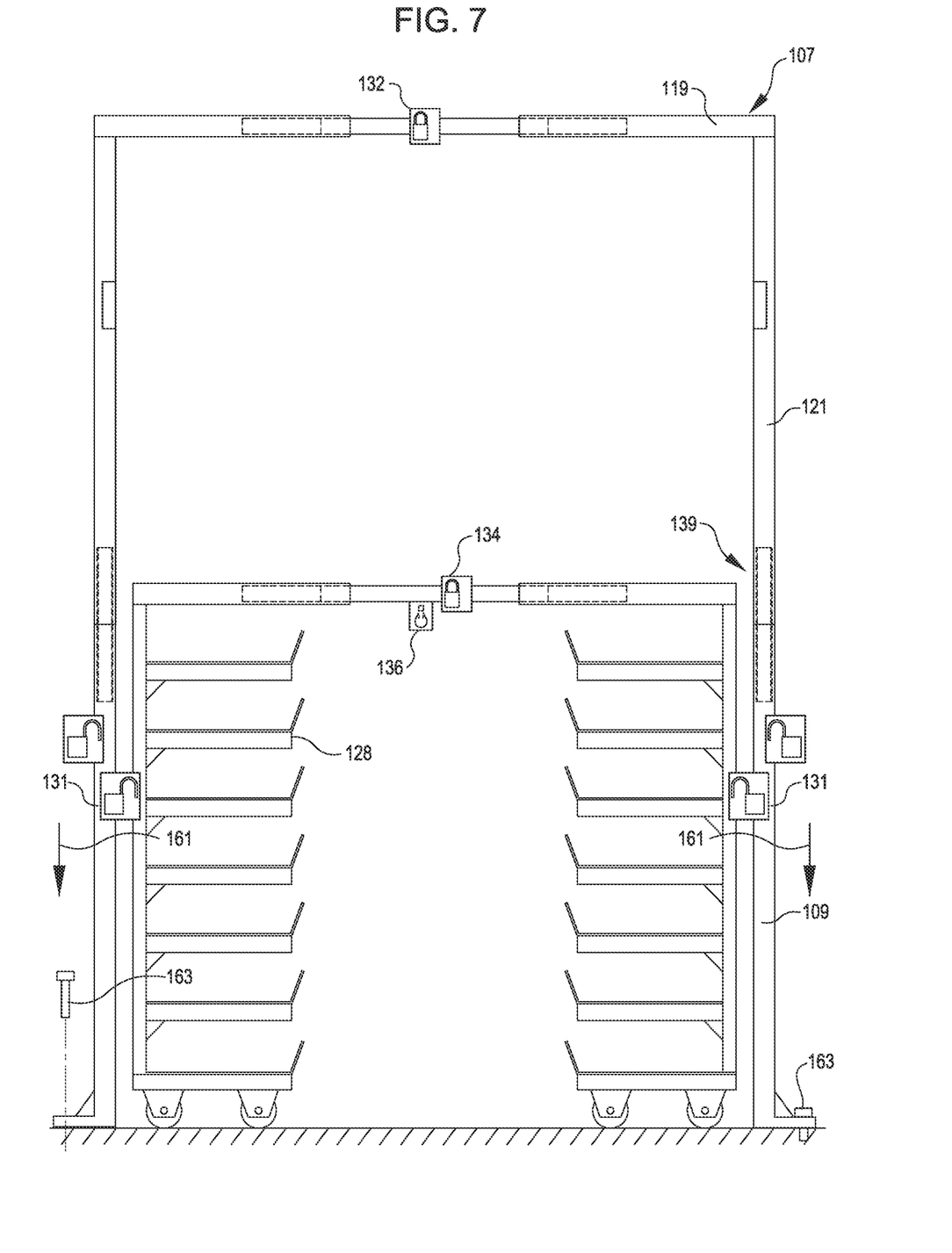

Turning to FIG. 7, the columns 109 can be released from the deployable assembly 103. In FIG. 7, the second set of releasable fasteners 131 is shown graphically with an unlocked symbol to denote a released state (in contrast to the lock symbol shown in FIG. 3). For example, the second set of releasable fasteners 131 can be released to permit movement of the columns 109 relative to or independent of the core chassis 105.

The release of the columns 109 may effectively release the vertically extended inverted-U-shaped structure (e.g., the combination of the columns 109 and the upper frame 107) for movement independent of the core chassis 105. The columns 109 (and as a result, the upper frame 107 coupled via the couplers 139) can be vertically lowered, such as depicted by arrows 161.

The column 109 can be secured relative to a floor or other surface of structural significance in a building of the datacenter or other environment. For example, the columns 109 in FIG. 7 are shown secured by bolts 163 through baseplates 130 of the columns 109, although adhesives, other fasteners, and/or other techniques may be utilized. Such anchoring or securing may stabilize the column 109 and/or the associated upper frame 107 for receipt of other elements.

Figure 8:
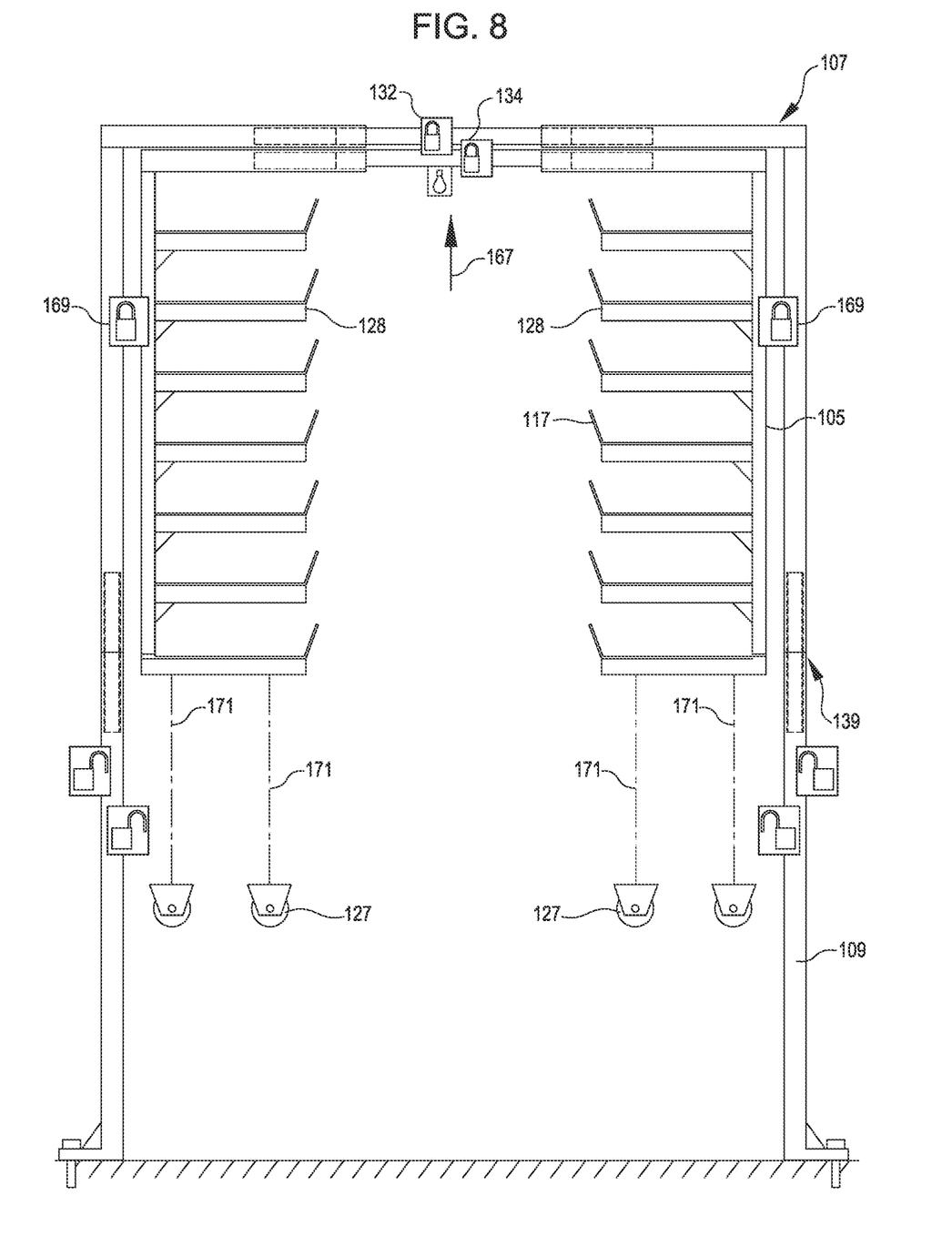

Turning to FIG. 8, the core chassis 105 can be raised (e.g., as depicted by arrow 167). For example, the core chassis 105 may be lifted utilizing a scissor lift, crane, or other suitable lifter.

Raising the core chassis 105 may position the core chassis 105 in a raised position within the upper frame 107. The core chassis 105 can be secured in the raised position within the upper frame 107 by connectors 169. The connectors 169 may correspond to plates or other structure of the first set of releasable fasteners 129 and/or the second set of releasable fasteners 131 (e.g., re-using such structure) or may correspond to distinct structures and/or different types of structure.

The rolling elements 127 may be removed (e.g., as depicted by the dot-dashed lines 171). For example, the rolling elements 127 may be removed from the core chassis 105 in the raised position within the upper frame 107.

Figure 9:
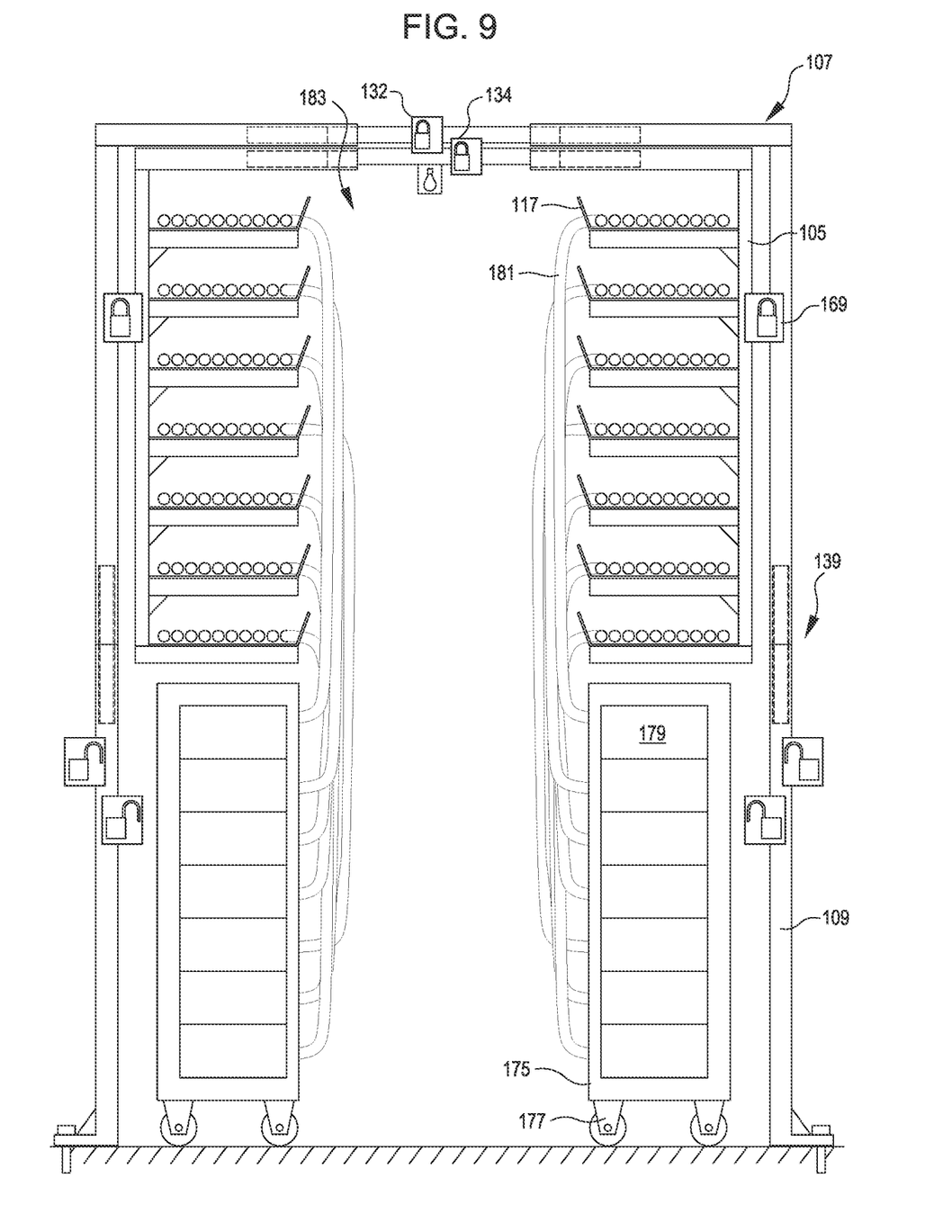

Turning to FIG. 9, computing-component racks 175 may be positioned under the trays 117 of the core chassis 105. For example, the computing-component racks 175 may be moved into position by wheels 177 on the bottom of the computing-component racks 175. Additionally or alternatively, the computing-component racks 175 may be assembled in place or otherwise installed without use of wheels 177. The computing-component racks 175 may be positioned beneath the core chassis 105 in the raised position. Computing components 179 may be positioned within the computing-component racks 175. As non-limiting examples the computing components 179 may include servers, network switches, or other electrical appliances. The computing components 179 may be connected with cabling 181, for example, which may be routed up into one or more of the trays 117 that may be positioned within a volume 183 bounded by or otherwise defined within the core chassis 105. Within the core chassis 105, other elements (such as represented by functional block 136) may be connected or otherwise initiated for use. For example, lights in the core chassis 105 may be connected to power, conduits may be connected with other suitable structures (e.g., to allow flow of coolant, airflow, data, power, or other mediums), and/or controllers or other control elements may be connected with other components capable of sending and/or receiving instructions and/or other control signals.

Figure 10:
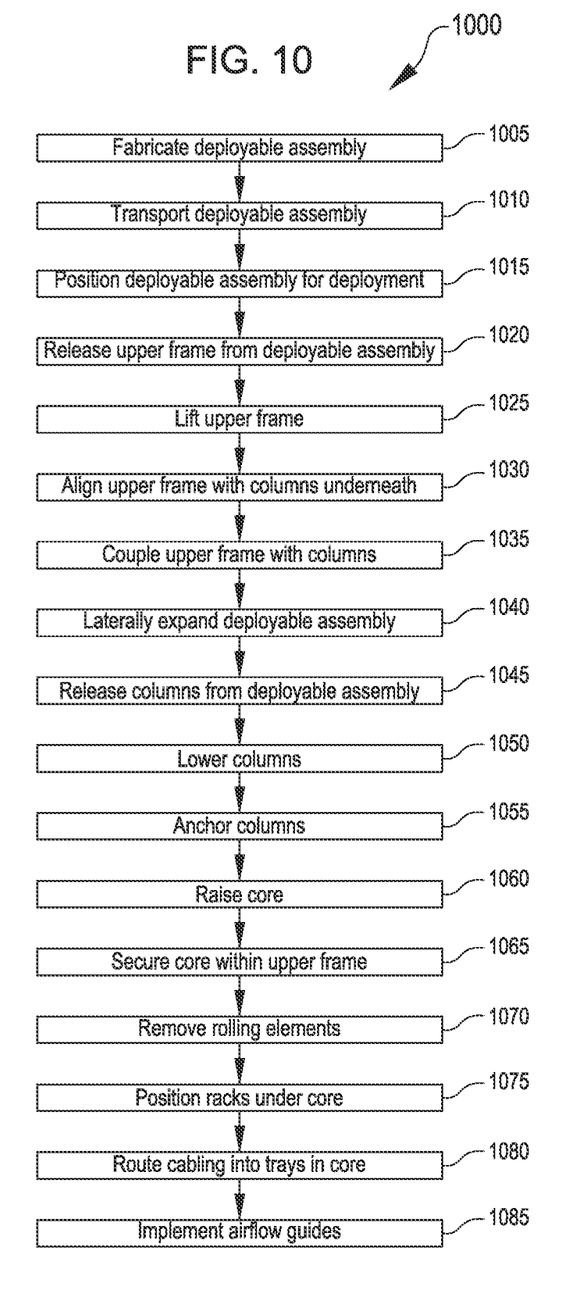
FIG. 10 is a flowchart illustrating an example of a process that may be implemented for a system according to various embodiments.

FIG. 10 illustrates a flowchart showing an example of a process 1000 that may be utilized with the system 101.

The process 1000 at 1005 can include fabricating a deployable assembly. For example, fabricating the deployable assembly may include fabricating a deployable assembly 103, such as by releasably coupling together the columns 109, the upper frame 107, and/or the core chassis 105.

The process at 1010 can include transporting the deployable assembly. For example, this may include transporting the deployable assembly 103 in a shipping container 125 or otherwise in a transport configuration. In some embodiments, the transport may be accomplished by wrapping suitable covers or protective elements around or with the deployable assembly 103, e.g., which may allow the deployable assembly 103 to be transported as a whole without being inserted into a separate shipping container 125.

The process 1000 at 1015 can include positioning a deployable assembly for deployment. For example, the deployable assembly 103 may be moved via the rolling elements 127 into a suitable position within a building for a datacenter or other environment, such as described with respect to FIG. 3. The positioning may include arranging the deployable assembly 103 in a position suitable for a datacenter cold aisle corridor, for example.

The process 1000 at 1020 can include releasing an upper frame from the deployable assembly. For example, this may correspond to release of the first set of releasable fasteners 129 to allow the upper frame 107 to move independently of the columns 109 and/or the core chassis 105.

The process 1000 at 1025 can include lifting the upper frame. For example, this may entail lifting of the upper frame 107 as described with respect to the arrow 135 in FIG. 4.

The process 1000 and 1030 can include aligning the upper frame with the columns underneath. For example, this may entail the lateral resizing depicted by arrows 137 in FIG. 4. The re-sizing at 1030 may be facilitated by unlocking the second lock 134, for example. Although the core chassis 105 is shown being laterally sized by movement in a lengthening or outward direction in FIG. 4, arrangements may include movement in an opposite direction, such as in situations in which the upper frame 107 is instead initially coupled in the deployable assembly 103 inwardly from the column 109. Alignment at 1030 can also include repositioning the upper frame 107 in a longitudinal direction (e.g., parallel to a direction of the runners 123 shown in FIG. 1), which may be useful, for example, in arrangements in which the uprights 121 of the upper frame 107 and the columns 109 are each coupled directly to the core chassis 105 or at least partially alongside one another along the longitudinal direction.

The process 1000 at 1035 can include coupling the upper frame with the columns. For example, this may include the use of couplers 139 and/or lowering of the upper frame 107 (e.g., as depicted by the arrows 151 in FIG. 5). As previously noted, although the couplers 139 are shown with posts 141, any other suitable coupling technique and/or structure may be utilized additionally or alternatively.

The process 1000 at 1040 can include laterally expanding the deployable assembly. This can include laterally extending the upper frame 107 along the beam 119 (e.g., as depicted by arrows 155 in FIG. 6). For example, the columns 109 may be moved apart from one another with the upper frame 107 coupled with the columns 109 so that the beam 119 of the upper frame 107 extends. The lateral expanding at 1040 can additionally or alternatively include extending the core chassis 105 along the lateral brace 111 (e.g., as depicted by the arrows 157 in FIG. 6). The beam 119 and the lateral brace 111 may be extended laterally in response to a single application of force to some elements of the deployable assembly 103. In some embodiments, the components may be laterally sized or re-sized once decoupled or released from one another rather than being simultaneously laterally extended in response to application of force to the deployable assembly 103 as a whole. The laterally extending at 1040 may be facilitated by unlocking the first lock 132 and/or the second lock 134, for example. The first lock 132 and/or the second lock 134 can be locked anew to facilitate stability and/or rigidity for subsequent actions.

The process 1000 at 1045 can include releasing columns from the deployable assembly. This can entail release of the columns 109 from the deployable assembly 103, such as from the core chassis 105. For example, this may correspond to releasing the second set of releasable fasteners 131 (e.g., as discussed with respect to FIG. 7).

The process 1000 at 1050 can include lowering the columns. For example, this may correspond to the movement described with respect to the arrows 161 in FIG. 7 and lowering the columns 109 with the upper frame 107 supported by the columns 109.

The process 1000 at 1055 can include anchoring the columns. For example, the columns 109 may be anchored by bolts 163 or any other suitable anchoring infrastructure or technique.

The process 1000 at 1060 can include raising the core. For example, this may include raising the core chassis 105, such as depicted graphically at arrow 167 in FIG. 8.

The process 1000 at 1065 can include securing the core within the upper frame. For example, this may include the core chassis 105 being coupled within the upper frame 107 by connectors 169.

The process 1000 at 1070 can include removing rolling elements. For example, this may include removing the rolling elements 127, such as from the core chassis 105 or from another portion of the deployable assembly 103.

The process 1000 at 1075 can include positioning racks under the core. For example, this can include the provision of computing-component racks 175 in the space below the core chassis 105, such as in between the columns 109. Placement of the computing-component racks 175 beneath the core chassis 105 may facilitate an arrangement of a cold aisle corridor, for example.

The process 1000 at 1080 can include routing cabling into trays in the core. This may include cabling 181 being placed in the tray 117 of the core chassis 105, such as described in FIG. 9, for example. Cabling 181 from multiple computing components 179 or multiple computing-component racks 175 may be positioned for suitable connection among components and organized and/or supported by the trays 117, for example.

The process 1000 at 1085 can include implementing airflow guides. For example, this may entail including suitable paneling or other airflow diversion structures to enclose or otherwise guide airflow relative to the core chassis 105 and/or among the upper frame 107 and/or column 109, e.g., to facilitate airflow delineation between cold zones and hot zones within a datacenter.

Variations in the order and/or presence of operations in the process 1000 may also be implemented. As one example, in some embodiments, lifting the upper frame 107 at 1025 also involves raising the core chassis 105 as at 1060 (e.g., the core chassis 105 may remain directly coupled with the upper frame 107, which may facilitate such combined operation). Hence, in this example or in other examples, the lateral expansion as at 1040 may entail expansion of the beam 119 of the upper frame 107 and/or the lateral brace 111 of the core chassis 105 while in a lifted position (e.g., subsequent to lifting the upper frame 107 at 1025 and/or raising the core chassis 105 at 1060). In this example or in other examples, the columns 109 may undergo operations (such as release from the deployable assembly 103 as at 1045, lowering as at 1050, and/or anchoring as at 1055) before, contemporaneously with, or after other operations such as lifting the upper frame at 1025 and/or raising the core chassis 105 as at 1060.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

Recitation of ranges of values herein are merely intended to serve as a shorthand method of referring individually to each separate value falling within the range, unless otherwise indicated herein and each separate value is incorporated into the specification as if it were individually recited herein.

All methods described herein can be performed in any suitable order unless otherwise indicated herein or otherwise clearly contradicted by context.

The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method of constructing a cold aisle corridor for a datacenter, the method comprising:
   positioning a deployable assembly within a building for the datacenter, the deployable assembly comprising a core chassis releasably fastened with an upper frame and a set of columns;
   releasing the upper frame from the deployable assembly;
   lifting the upper frame;
   coupling lower ends of the upper frame with upper ends of the columns;
   laterally expanding the deployable assembly to cause extension of horizontal members of the upper frame and the core chassis to a size at which the deployable assembly defines a width of the cold aisle corridor;
   releasing the core chassis from the columns; and
   raising the core chassis into a raised position within the upper frame.

2. The method of claim 1, further comprising securing the core chassis in the raised position within the upper frame.

3. The method of claim 1, further comprising:
   positioning computing-component racks beneath the core chassis in the raised position; and
   routing cabling from the computing-component racks into at least one cable tray within a volume bounded by the core chassis.

4. The method of claim 1, wherein the positioning the deployable assembly includes moving the deployable assembly via rolling elements coupled with an underside of the core chassis, wherein the method further comprises removing the rolling elements from an underside of the core chassis in the raised position.

5. A method of defining an aisle corridor of a datacenter, the method comprising:
   positioning a deployable assembly, the deployable assembly comprising an upper frame releasably fastened alongside a set of columns such that uprights of the upper frame are positioned alongside the columns;
   moving the upper frame vertically upward relative to the columns;
   laterally re-positioning the columns into a position vertically below the upper frame to cause alignment of lower ends of the upper frame with upper ends of the columns for coupling;
   coupling the upper frame with the columns so the columns are supporting the upper frame; and
   laterally expanding the deployable assembly to cause extension of a beam of the upper frame to at least partially define bounds of the aisle corridor of the datacenter.

6. The method of claim 5, wherein the laterally expanding the deployable assembly comprises moving the columns apart from one another with the upper frame coupled with the columns so that the beam of the upper frame extends toward a size corresponding to a width of the aisle corridor of the datacenter.

7. The method of claim 5, wherein the positioning the deployable assembly includes moving the deployable assembly via rolling elements coupled with an underside of the deployable assembly, wherein the method further comprises removing the rolling elements subsequent to the positioning the deployable assembly.

8. The method of claim 5, further comprising lowering the columns with lower ends of the upper frame coupled with upper ends of the columns.

9. The method of claim 5, further comprising, with lower ends of the upper frame coupled with upper ends of the columns, anchoring the columns to a floor.

10. The method of claim 5, further comprising raising a core chassis of the deployable assembly into a raised position within the upper frame.

11. The method of claim 5, wherein the method is a method of constructing a cold aisle corridor for the datacenter;
   wherein the positioning the deployable assembly comprises positioning the deployable assembly within a building for the datacenter and the deployable assembly further comprises a core chassis releasably fastened with the upper frame and the set of columns;
   wherein the method further comprises releasing the upper frame from the deployable assembly;
   wherein the moving the upper frame vertically upward comprises lifting the upper frame;
   wherein the laterally expanding the deployable assembly causes extension of horizontal members of the upper frame and the core chassis, wherein the horizontal members include the beam of the upper frame;
   wherein the method further comprises releasing the core chassis from the columns; and
   wherein the method further comprises raising the core chassis into a raised position within the upper frame.

12. A deployable assembly deployable for constructing an aisle corridor of a datacenter, the deployable assembly comprising:
   an upper frame comprising uprights connected by a telescoping beam adjustable between a first lateral size in a transit configuration and second lateral size in a deployed configuration, the upper frame defining a width of the aisle corridor in the deployed configuration;
   columns releasably fastened with the upper frame, the columns positioned alongside the uprights in the transit configuration and supporting the uprights from underneath in the deployed configuration; and a core chassis securable within the upper frame in the deployed configuration, wherein the core chassis comprises a lateral brace that is laterally extendable to convert the core chassis between lateral sizes.

13. The deployable assembly of claim 12, wherein the upper frame is sized for defining an upper region of the aisle corridor of the datacenter in the deployed configuration.

14. The deployable assembly of claim 12, further comprising releasable fasteners by which the core chassis, the upper frame, and the columns are releasably fastened together in the transit configuration so that the upper frame and the columns are positioned at least partially along sides of the core chassis.

15. The deployable assembly of claim 12, wherein the uprights and the telescoping beam of the upper frame are arranged to define an inverted-U shape, wherein the deployable assembly further comprises couplers configured for joining the columns with the uprights of the upper frame so as to define a vertically extended inverted-U shape.

16. The deployable assembly of claim 12, wherein the upper frame comprises a plurality of inverted-U shapes joined by longitudinal runners.

17. The deployable assembly of claim 12, further comprising rolling elements coupled with an underside of the deployable assembly.

\* \* \* \* \*